(12) United States Patent
Huang et al.

(10) Patent No.: US 10,826,488 B2
(45) Date of Patent: **\*Nov. 3, 2020**

(54) SWITCH DEVICE WITH SWITCH CIRCUITS THAT PROVIDE HIGH VOLTAGE SURGE PROTECTION

(71) Applicant: FAIRCHILD SEMICONDUCTOR CORPORATION, Phoenix, AZ (US)

(72) Inventors: Lei Huang, Sunnyvale, CA (US); Na Meng, Beijing (CN); Kenneth P. Snowdon, Falmouth, ME (US)

(73) Assignee: FAIRCHILD SEMICONDUCTOR CORPORATION, Phoenix, AZ (US)

( \* ) Notice: Subject to any disclaimer, the term of this patent is extended or adjusted under 35 U.S.C. 154(b) by 34 days.

This patent is subject to a terminal disclaimer.

(21) Appl. No.: 16/299,843

(22) Filed: Mar. 12, 2019

(65) Prior Publication Data

US 2019/0207604 A1 Jul. 4, 2019

Related U.S. Application Data

(63) Continuation of application No. 14/793,382, filed on Jul. 7, 2015, now Pat. No. 10,270,438.

(60) Provisional application No. 62/090,981, filed on Dec. 12, 2014.

(51) Int. Cl.
*H02H 3/20* (2006.01)
*H02H 9/04* (2006.01)
*H03K 17/687* (2006.01)

(52) U.S. Cl.
CPC .......... *H03K 17/687* (2013.01); *H02H 3/202* (2013.01)

(58) Field of Classification Search
CPC .......... H03K 17/687; H02H 3/20; H02H 9/04
USPC ...................................... 361/91.5
See application file for complete search history.

(56) References Cited

U.S. PATENT DOCUMENTS

| 5,689,209 | A | 11/1997 | Williams et al. |
| 8,624,625 | B2 | 1/2014 | Shin et al. |
| 9,025,288 | B2 | 5/2015 | Vemula et al. |
| 2004/0251952 | A1 | 12/2004 | Nakatsuka et al. |
| 2012/0243712 | A1 | 9/2012 | Yamada |
| 2013/0335121 | A1 | 12/2013 | Castaldo et al. |

FOREIGN PATENT DOCUMENTS

CN 102694533 A 9/2012

OTHER PUBLICATIONS

Chinese Office Action for Chinese Patent Application No. 201510727650.0, dated Apr. 3, 2018.

*Primary Examiner* — Jared Fureman
*Assistant Examiner* — Lucy M Thomas
(74) *Attorney, Agent, or Firm* — AMPACC Law Group, PLLC

(57) ABSTRACT

A switch device includes a common node that is connected to end nodes, such as that of computer interface ports. The switch device includes several switch circuits that can be connected in series to form a switch path between the common node and an end node. A switch circuit can include a main switch, such as a transistor that can be configured to withstand a positive or negative voltage surge by automatically changing the connection of its gate.

20 Claims, 16 Drawing Sheets

SWITCH DEVICE WITH SWITCH CIRCUITS THAT PROVIDE HIGH VOLTAGE SURGE PROTECTION

CROSS-REFERENCE TO RELATED APPLICATION

This application is a continuation of and claims priority to U.S. application Ser. No. 14/793,382, filed on Jul. 7, 2015, which claims the benefit of U.S. Provisional Application No. 62/090,981, filed on Dec. 12, 2014, both of which are incorporated herein by reference in their entirety.

BACKGROUND OF THE INVENTION

1. Field of the Invention

The present invention relates generally to electrical circuits, and more particularly but not exclusively to switch devices and associated circuits.

2. Description of the Background Art

Switch circuits are employed in switch devices that connect a common node to multiple end nodes, such as in computer interface port applications. As a particular example, a switch circuit can be used in a switch device for connecting one port to a plurality of computer interface ports, such as Universal Serial Bus (USB) ports, audio ports, etc. In that example, the switch circuit may be part of a micro USB switch (MUS) device. A switch device may include a transient voltage suppression (TVS) diode to protect switch circuits from high voltage surges.

SUMMARY

In one embodiment, a switch device includes a common node that is connected to end nodes, such as that of computer interface ports. The switch device includes several switch circuits that can be connected in series to form a switch path between the common node and an end node. A switch circuit can include a main switch, such as a transistor that can be configured to withstand a positive or negative voltage surge by automatically changing the connection of its gate.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In the present disclosure, transistors that are labeled with an "N" (e.g., N0, N1, N2, etc.) are N-type metal oxide semiconductor (NMOS) transistors and transistors that are labeled with a "P" (e.g., P1, P2, etc.) are P-type metal oxide semiconductor (PMOS) transistors. Furthermore, transistors that are labeled with an "HV" is a high voltage transistor. As a particular example, "HVN" (e.g., HVN1, HVN2, etc.) denotes a high voltage NMOS transistor and "HVP" (e.g., HVP1, HVP2, etc.) denotes a high voltage PMOS transistor. As can be appreciated, the provided transistor types are for illustration purposes only. Other transistors may also be used depending on the particulars of the application.

A TVS diode may be employed in a switch device to protect against high voltage surges. However, the use of a TVS diode may be undesirable in some applications. For example, an external TVS diode may be undesirable on common nodes of an MUS device in applications where the number of external components is minimized. A switch circuit of such an MUS device must therefore survive a high voltage (e.g., +/−22V) surge test without a TVS diode providing a voltage clamp.

Figure 1:
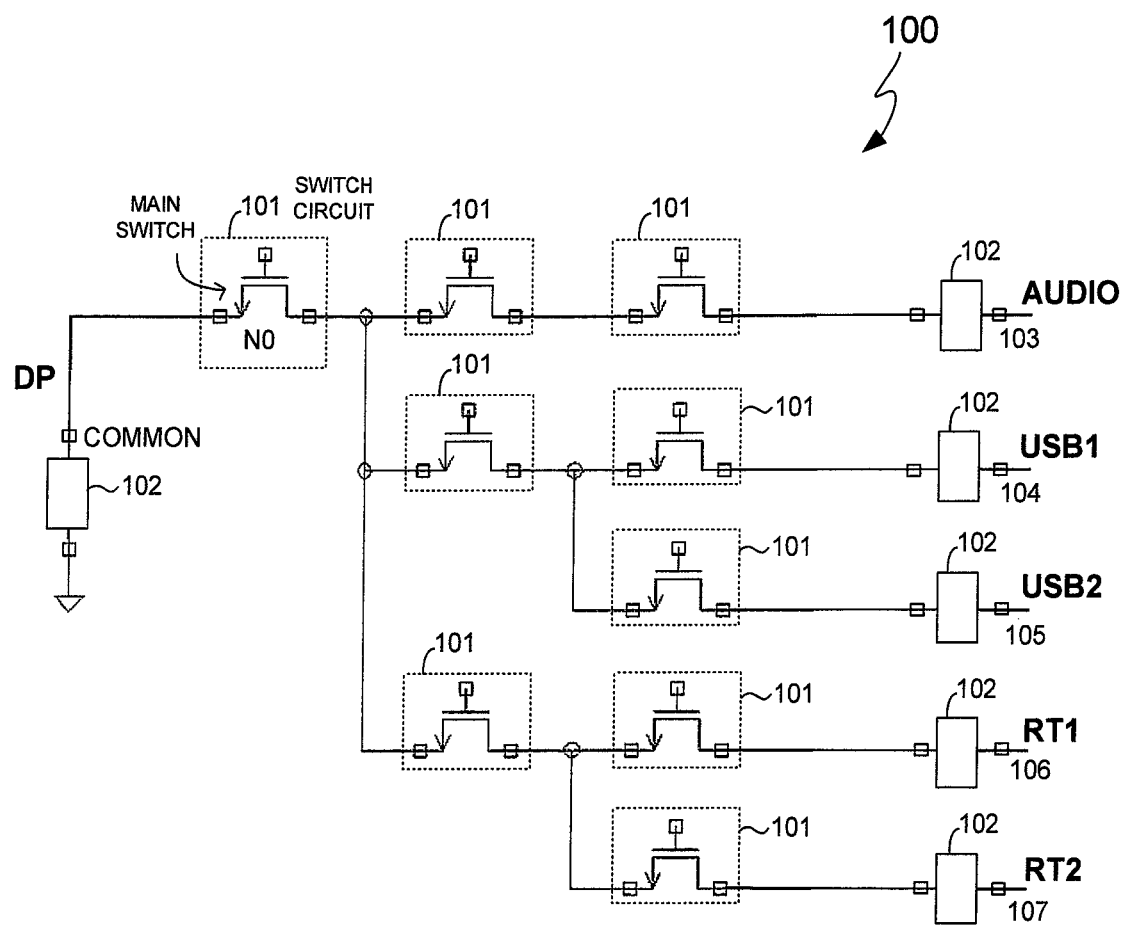
FIG. 1 shows a schematic diagram of a switch device in accordance with an embodiment of the present invention.

FIG. 1 shows a schematic diagram of a switch device 100 in accordance with an embodiment of the present invention. The switch device 100 may comprise an MUS device, for example. In the example of FIG. 1, the switch device 100 connects a common node to one or more ends nodes, which may comprise a plurality of computer interface ports. In the example of FIG. 1, the switch device 100 is configured to connect a common node DP to one or more of the end nodes 103-107. In the example of FIG. 1, the nodes 103-107 comprise, respectively, an audio port, a first USB port (USB1), a second USB port (USB2), a first receiver/transmitter port (RT1), and a second receiver/transmitter port (RT2). A node may be connected to a pin, which in turn may be connected to a pad 102 to allow convenient access to the node. For example, during surge testing, a test voltage may be introduced into the switch device 100 by way of the pads 102. The test voltage may be applied on the pad 102 of the common node DP to simulate a positive or negative surge voltage on a switch path.

A switch path may comprise at least two opposing nodes: a common node on one end and an end node on the other end. In the example of FIG. 1, the switch device 100 includes a plurality of switch paths, including a first switch path from the common node DP to the end node 103, a second switch path from the common node DP to the end node 104, a third switch path from the common node DP to the end node 105, a fourth switch path from the common node DP to the end node 106, and a fifth switch path from the common node DP to the end node 107. The switch device 100 may include more or fewer switch paths depending on the number of end nodes to be connected to the common node.

In the example of FIG. 1, each switch path comprises one or more series-connected switch circuits 101. As a particular example, the switch path from the common node DP to the end node 103 comprises three series-connected switch circuits 101, the switch path from the common node DP to the end node 104 comprises three series-connected switch circuits 101, the switch path from the common node DP to the end node 105 comprises three series-connected switch circuit s101, etc. Turning ON all switch circuits 101 along a switch path connects a common node on one end of the switch path to an end node of the switch path. A switch path may be opened by turning OFF a switch circuit 101 along that switch path. A data source or receiver on the common node DP may thus be connected or disconnected to any of the end nodes 103-107 by turning ON/OFF particular switch circuits 101.

Figure 10:
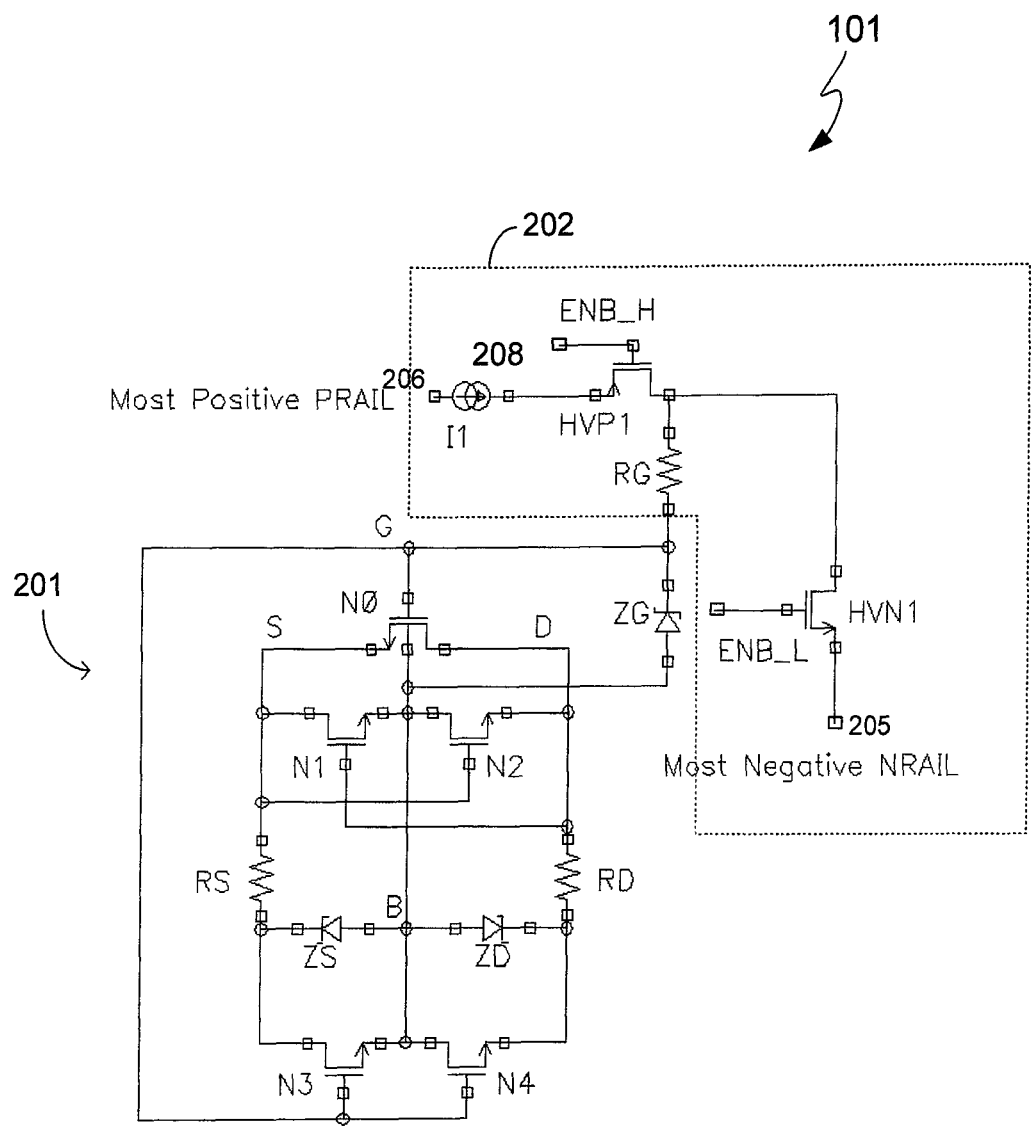
FIG. 10 shows a schematic diagram of a switch circuit in accordance with an embodiment of the present invention.

In the example of FIG. 1, a switch circuit 101 is represented by its main switch, which in the example of FIG. 1 is a transistor NO (shown also in FIG. 10). Only one transistor NO is labeled in FIGS. 1-3 for clarity of illustration. Generally speaking, the main switch of a switch circuit 101 may comprise a low voltage NMOS or PMOS transistor with high voltage isolation. For example, a main switch may comprise an isolated NMOS switch device, which is an electrostatic discharge (ESD) protection type of device.

Turning ON a switch circuit 101 turns ON its main switch to allow a signal to flow between the source and drain of the main switch. A plurality of switch circuits 101 may be connected in series by connecting a source of a main switch of a switch circuit 101 to a drain of a main switch of an adjacent switch circuit 101, and so on. In one embodiment, a switch circuit 101 provides high voltage surge protection along a switch path. Accordingly, the switch device 100 does not necessarily require a TVS diode on a common node for high-voltage surge protection.

A main switch of a switch circuit 101 may be part of a switch core (e.g., FIG. 10, switch core 201). The gate of a transistor that is being used as the main switch may be automatically connected to either its source or its drain to turn OFF the transistor in response to a surge.

Generally speaking, the gate of the transistor being employed as the main switch may be automatically connected to either its own source or its own drain depending on a potential on its source relative to a potential on its drain. With an NMOS transistor being employed as a main switch, the gate of the NMOS transistor may be connected to either its source or drain depending on which one has lower potential to protect against transient low voltage gate-to-source voltage VGS. For example, when a source of an NMOS transistor being employed as the main switch has lower potential compared to its drain, connecting the gate and source of the NMOS transistor together results in the voltage VGS of the NMOS transistor to be zero, thereby turning OFF the NMOS transistor and providing surge protection on the switch path. In the same example, when the drain of the NMOS transistor has lower potential compared to the source of the NMOS transistor, the gate and drain of the NMOS transistor may be connected together to turn OFF the NMOS transistor during a surge.

In one embodiment, each switch circuit 101 is configured to drop a particular voltage, which may depend on the component parameters of the switch circuit 101. The number of switch circuits 101 on a switch path may thus dictate the surge protection along the switch path. For example, assuming that each switch circuit 101 is configured to drop 8 volts, a switch path with three series-connected switch circuits 101 can protect the switch path against a 24V surge (3×8V). As can be appreciated, the voltage drop on a switch circuit 101 and the number of series-connected switch circuits 101 on a given switch path may vary depending on the particulars of the application.

Figure 2:
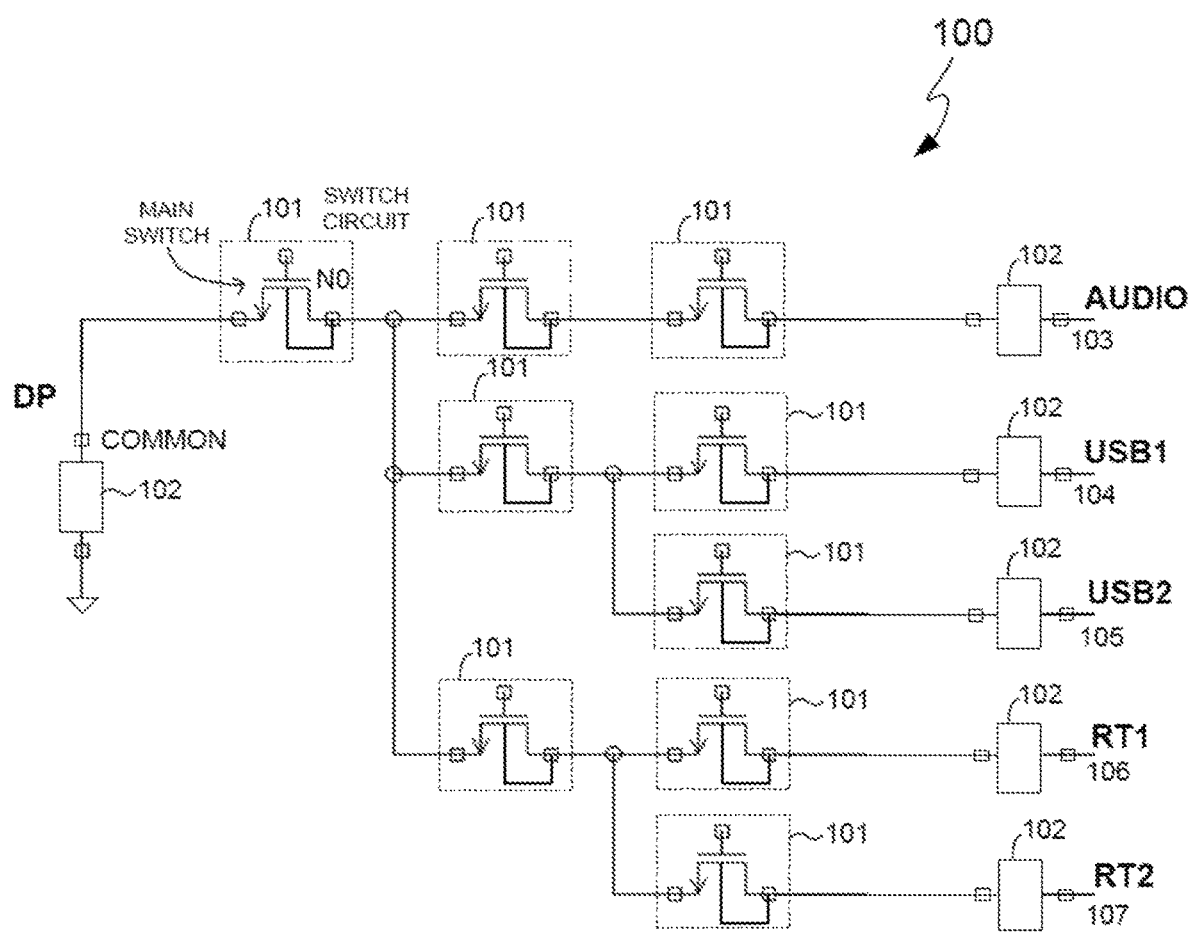
FIGS. 2 and 3 show switch circuits of the switch device of FIG. 1 as configured to withstand a positive surge and a negative surge, respectively, in accordance with an embodiment of the present invention.
Figure 3:
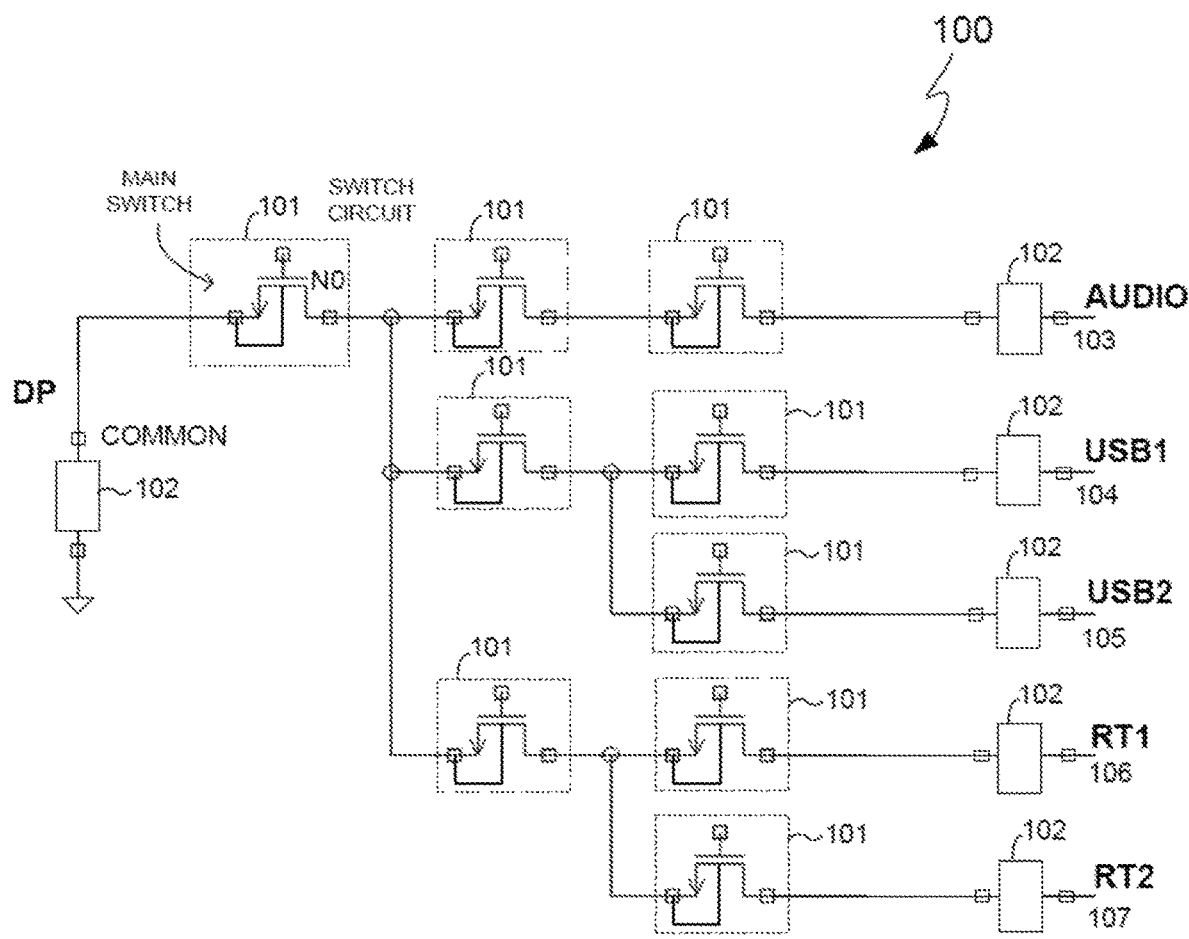

FIGS. 2 and 3 show the switch circuits 101 as configured to withstand a positive surge and a negative surge, respectively, in accordance with an embodiment of the present invention. In the example of FIGS. 2 and 3, each switch circuit 101 is configured to withstand 8V. Therefore, in applications requiring the switch device 100 to survive a +/−22V surge test, three switch circuits 101 may be connected in series between the common node DP and a node of an interface port. In that configuration, the series-connected switch circuits 101 drop a total of about 24 volts (3×8V), allowing the switch device 100 to withstand a +/−22V surge test. When 24V is introduced on the common node DP for surge testing, the 24V may be divided equally between three series-connected switch circuits 101 on the switch path.

To withstand a positive surge voltage that is present on the common node DP, a main switch of a switch circuit 101 may have its gate connected to its drain as in FIG. 2. The main switch may have its gate connected to its source as in FIG. 3 when the switch circuit 101 is configured to withstand a negative surge voltage on the common node DP. In general, the gate of a main switch is automatically connected to either its source or drain to turn the main switch OFF in response to the surge. With an NMOS transistor as a main switch, the gate of the NMOS transistor may be automatically connected to the lower voltage of its drain and source in response to the surge. With a PMOS as a main switch, the gate of the PMOS transistor may be automatically connected to the higher voltage of its drain and source in response to the surge.

Figure 4:
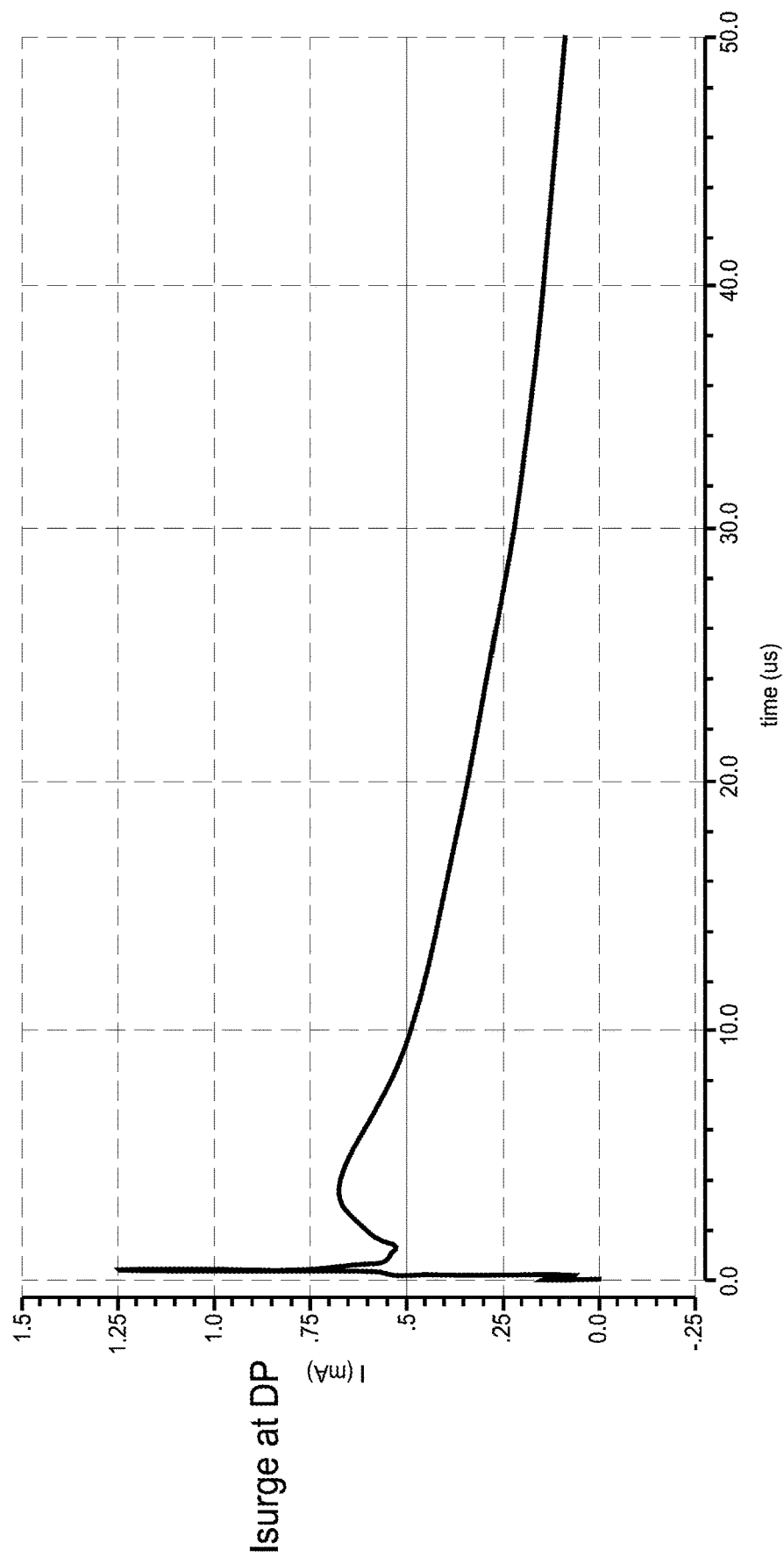
FIGS. 4 and 5 show surge simulations for a switch device that is configured as in FIG. 2 in accordance with an embodiment of the present invention.
Figure 5:
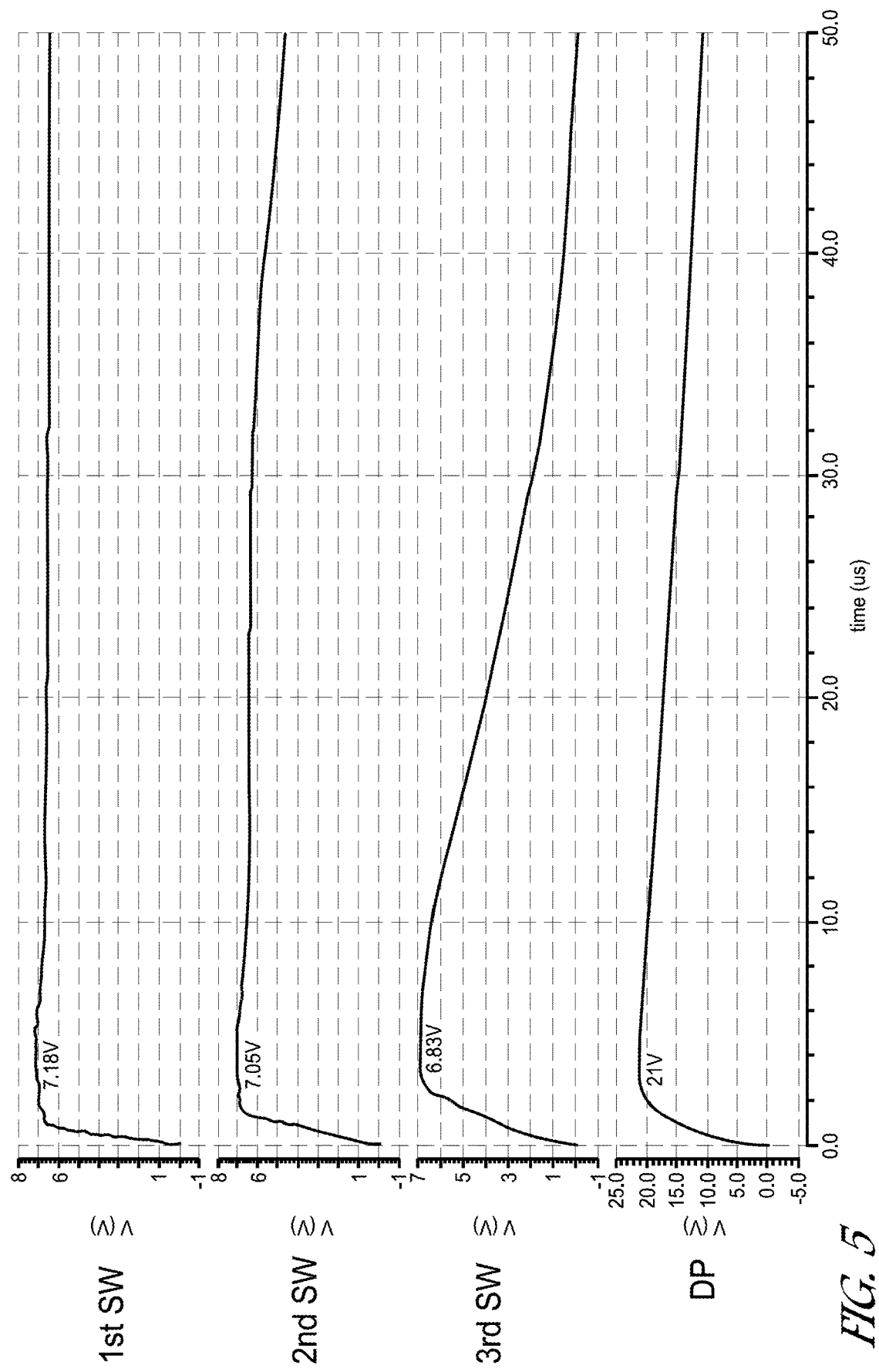

FIGS. 4 and 5 show surge simulations for a switch device 100 that is configured to withstand a positive surge as in FIG. 2. FIG. 4 shows the resulting surge current at the common node DP when a +22V surge is applied on the common node DP. FIG. 5 shows the resulting voltage drop on each of the switch circuits 101 on the switch path with the +22V surge.

Figure 6:
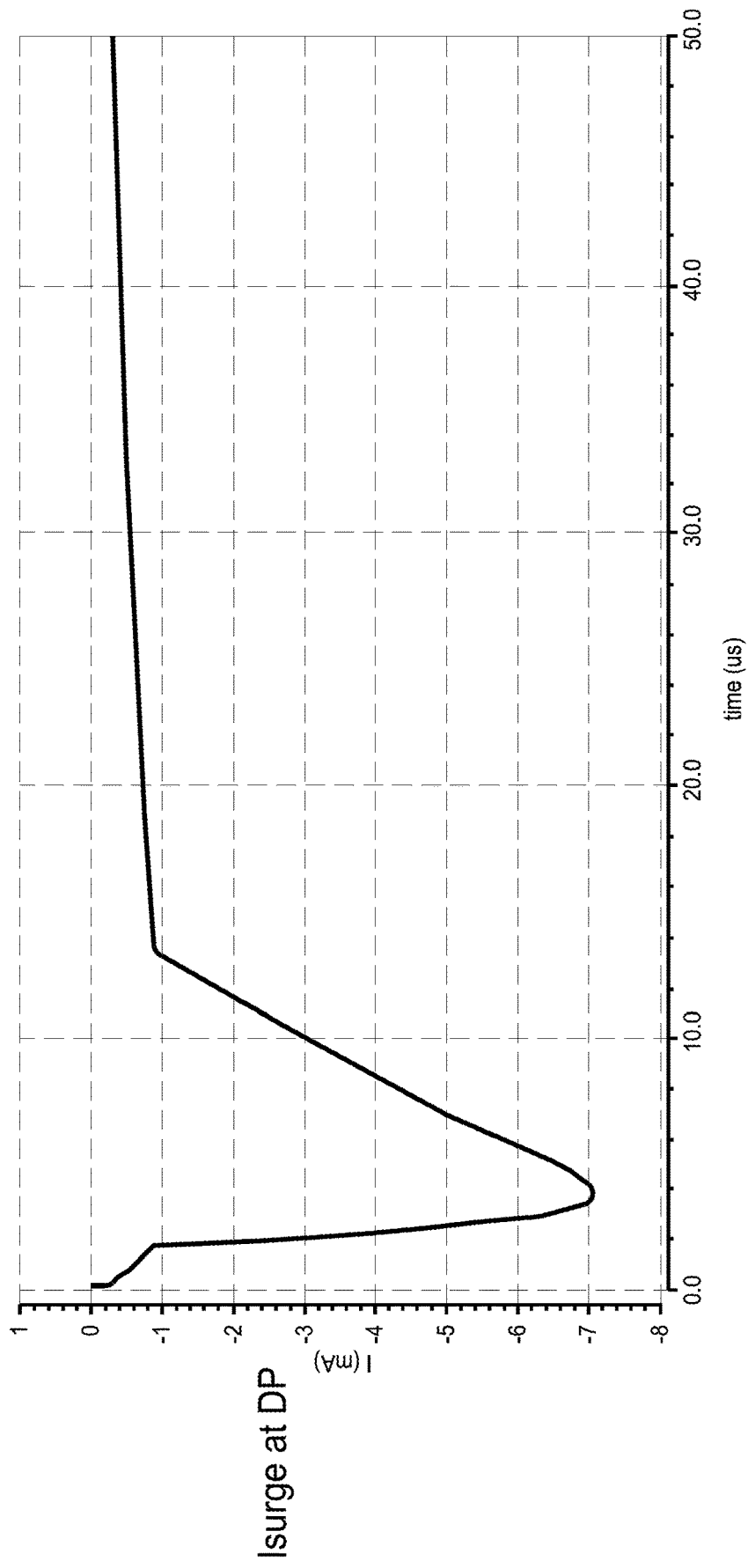
FIGS. 6 and 7 show surge simulations for a switch device that is configured as in FIG. 3 in accordance with an embodiment of the present invention.
Figure 7:
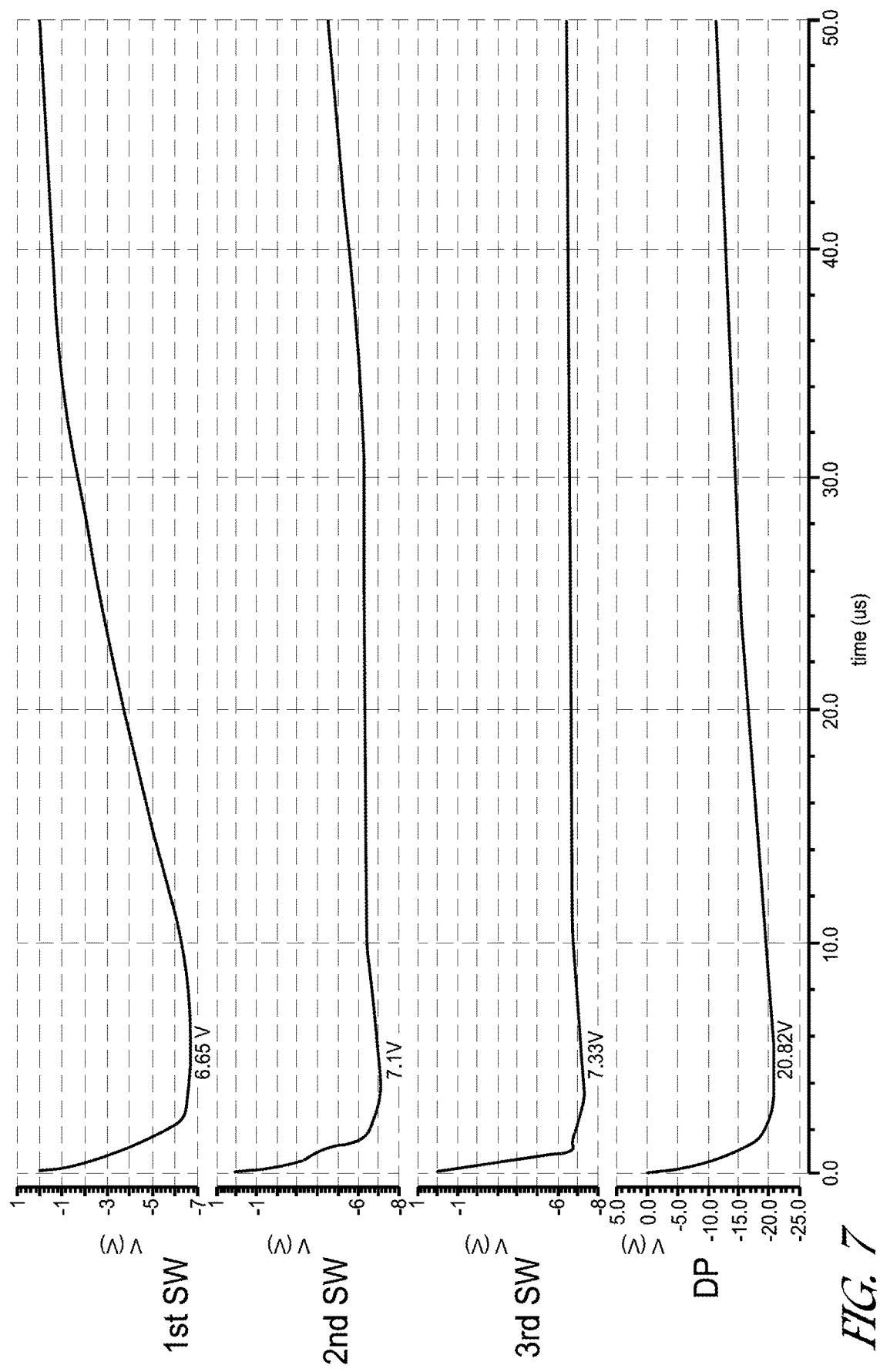

FIGS. 6 and 7 show surge simulations for a switch device 100 that is configured to withstand a negative surge as in FIG. 3. FIG. 6 shows the resulting surge current at the common node DP when a −22V surge is applied on the common node DP. FIG. 7 shows the resulting voltage drop on each of the switch circuits 101 on the switch path with the −22V surge. The surge simulations of FIGS. 4-7 show that a switch path with series-connected switch circuits 101 has relatively low current flow during a surge. More specifically, when +/−22V is introduced on the common node DP, the resulting surge current is relatively small.

Figure 8:
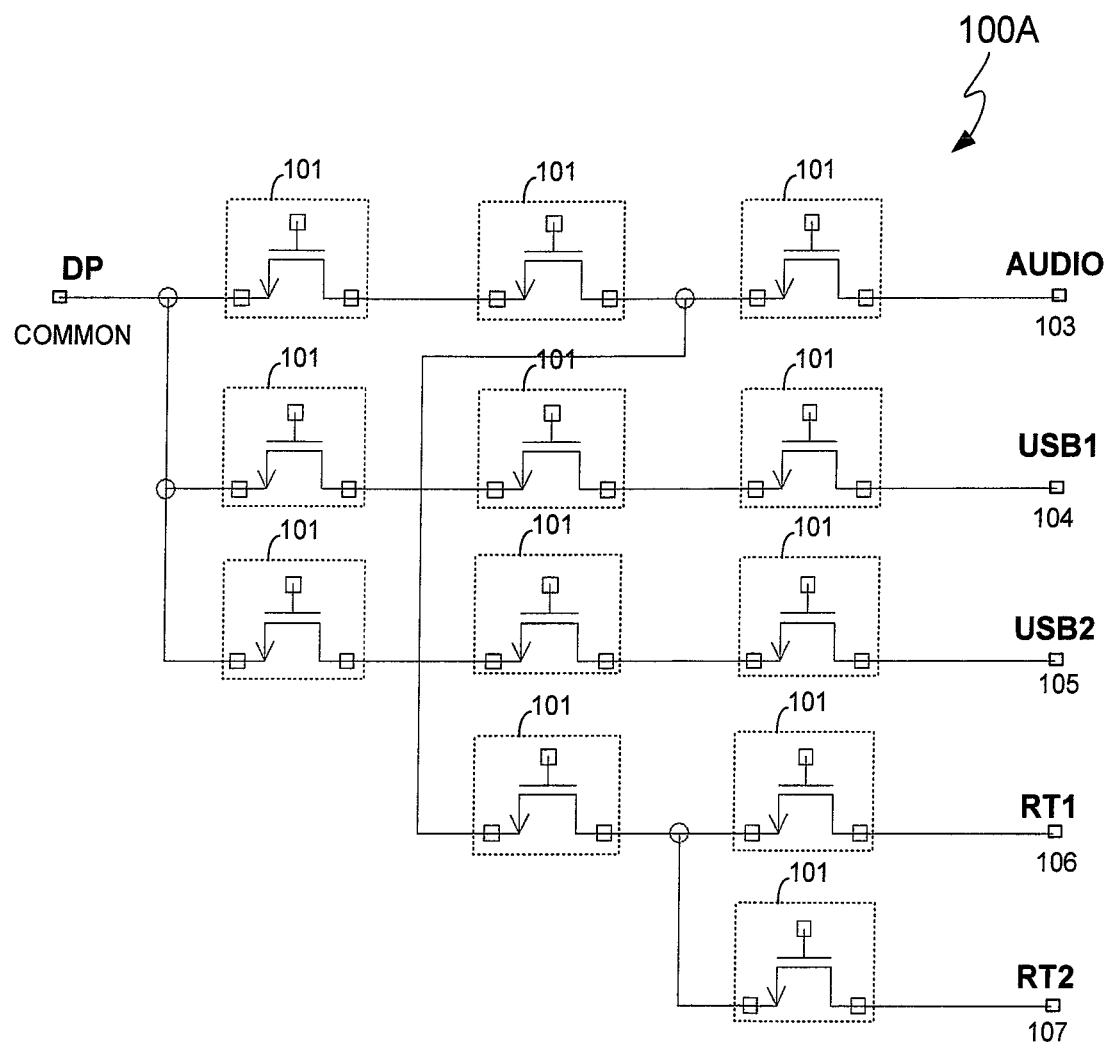
FIGS. 8 and 9 show schematic diagrams of switch devices in accordance with embodiments of the present invention.
Figure 9:
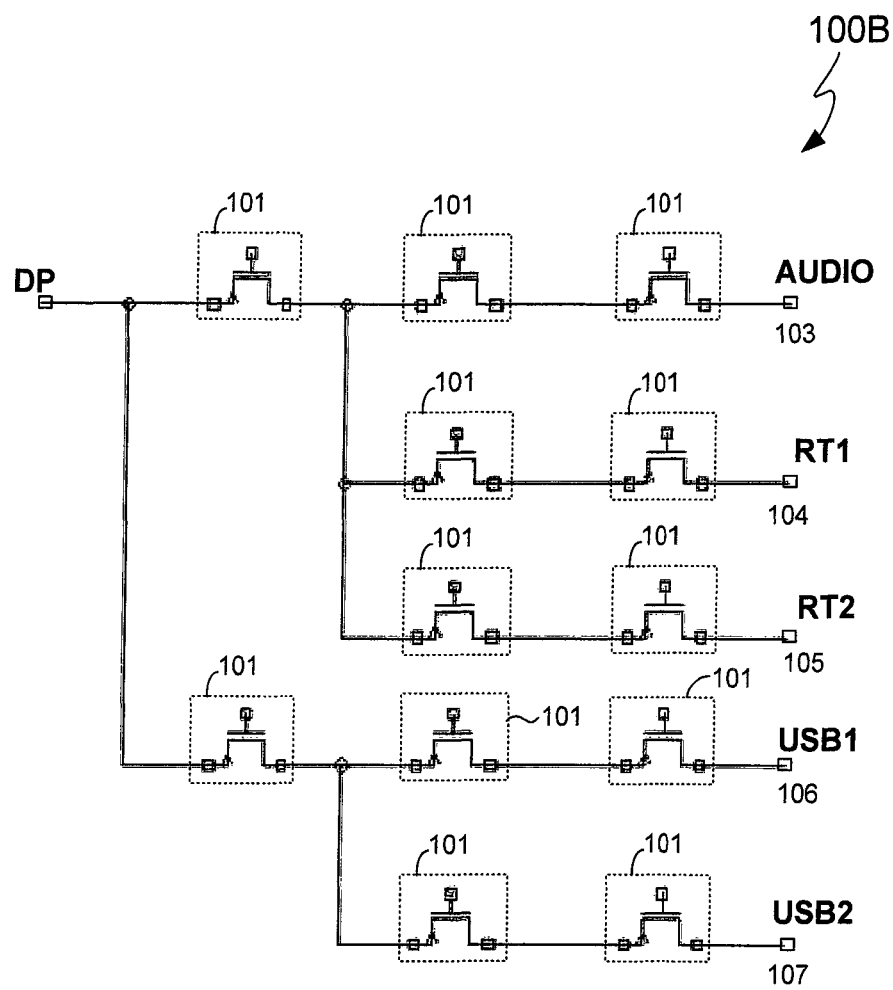

The number of switch circuits 101 and the connection between a common node and an end node of a switch device 100 may be varied to optimize surge protection and bandwidth of a switch path. FIG. 8 shows a schematic diagram of a switch device 100A, which is a particular implementation of the switch device 100. In the example of FIG. 8, the USB ports on nodes 104 and 105 have separate switch paths to the common node DP. To reduce the OFF capacitance on the common node DP, the audio port on the node 103 and receiver/transmitter ports on the nodes 106 and 107 share a path to the common node DP. In some implementations, this allows the switch device 100A to have a parasitic capacitance of 1.4 pf and a bandwidth of about 822 MHz. As can be appreciated, a switch device 100 may have other switch path configurations. For example, FIG. 9 shows a schematic diagram of a switch device 100B, which is another particular implementation of the switch device 100.

FIG. 10 shows a schematic diagram of a switch circuit 101 in accordance with an embodiment of the present invention. In the example of FIG. 10, the switch circuit 101 comprises a switch core 201 and a gate control driver 202. In the example of FIG. 10, the transistor NO is the main switch of the switch circuit 101.

In the example of FIG. 10, the switch circuit 101 includes a Zener diode ZG that serves as a voltage clamp. When the switch circuit 101 is enabled (i.e., turned ON), the transistor HVN1 is OFF and current flows to the resistor RG and the Zener diode ZG to create a constant gate-source voltage VGS of the transistor NO. When the switch circuit 101 is disabled (i.e., turned OFF), the transistor HVN1 is ON and pulls down the gate of the transistor NO, the resistor RG limits current flow to the gate of the transistor NO, and the Zener diode ZG clamps the gate voltage of the transistor NO. The Zener diode ZS, resistor RS, Zener diode ZD, and resistor RD form a breakdown circuit that sets a breakdown voltage for the drain-to-source voltage VDS of the transistor NO. Advantageously, relying on the break down voltage BVDSS of the transistor NO for surge protection is not necessary because the breakdown voltage set by the breakdown circuit is lower than the BVDSS of the transistor NO.

More specifically, when the switch circuit 101 is enabled, the enable signal ENB_H turns ON the transistor HVP1, the transistor HVN1 is turned OFF by the enable signal ENB_L, and current I1 generated by a current source 208 flows to the node B (which is connected to the bulk of the transistor NO) through the resistor RG and the Zener diode ZG. The transistors N3 and N4 serve as a voltage divider network that divides the source and drain voltages of the transistor NO by half. More specifically, when the switch circuit 101 is enabled, the transistors NO, N3, and N4 are ON and the node B is equal to half of the voltages at the source and drain of the transistor NO, i.e., B=(S+D)/2.

In the example of FIG. 10, the transistors N1 and N2 form a cross-coupling circuit that allows for automatic connection of the gate of the transistor NO to either the source or drain of the transistor NO depending on which one has lower potential. In the example of claim 10, a source of the transistor N1 is connected to a drain of the transistor N2, a drain of the transistor N1 is connected to the source of the transistor NO, a source of the transistor N2 is connected to the drain of the transistor NO, a gate of the transistor N1 is connected to the drain of the transistor NO, and a gate of the transistor N2 is connected to the source of the transistor NO.

During a surge, the switch circuit 101 is disabled, the transistors N1 and N2 set the node B to the minimum of the source and drain voltages of the transistor NO (i.e., B=min (S,D)), the transistor HVP1 is OFF, the transistor HVN1 is ON, and the node G (i.e., gate of the transistor NO) is pulled down to NRAIL by the transistor HVN1 and resistor RG. The Zener diode ZG clamps the node G to be B−V(ZG), which is approximately min(S,D)−0.7V so that the transistors NO, N3, and N4 can be turned OFF safely during a surge.

As a particular example, suppose the node D (i.e., the drain of the transistor NO) is at 8V, the node S (i.e., the source of the transistor NO) is at 0V, the node B is min(S,D) which is at 0V, the Zener diode ZD breakdown and the resistor RD limit the current from the node D to the node S, which is through the resistor RD, Zener diode ZD, and the transistor N1. The current from the node D to the node S is thus [D−S−V(ZD)]/RD. Each switch circuit 101 may have the same resistor RD and Zener voltage V(ZD) and the same current through the resistor RG (which is very small and can be ignored), therefore the drain-to-source voltage of each switch circuit 101 should be approximately the same.

In the example of FIG. 10, the transistor NO, which serves as the main switch, is an NMOS transistor. Accordingly, the gate of the transistor NO is automatically connected to the minimum of its source and drain, i.e., G=min(S,D), to turn OFF the transistor NO in response to a surge. In other embodiments where the main switch is a PMOS transistor, the switch core 201 may be adapted to automatically connect the gate of the PMOS transistor to the maximum of its source and drain, i.e., G=max(S,D), to turn OFF the PMOS transistor in response to a surge, such as by replacing the transistors N1 and N2 of FIG. 10 with PMOS transistors (i.e., P1 and P2), for example.

Figure 11:
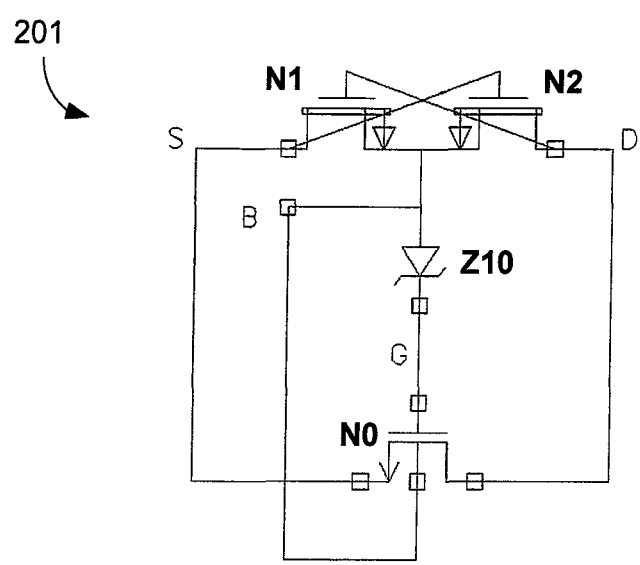
FIG. 11 shows a simplified schematic diagram of the switch circuit of FIG. 10

FIG. 11 shows a simplified schematic diagram of the switch circuit 101 of FIG. 10 in accordance with an embodiment of the present invention. FIG. 11 shows the cross-coupling circuit comprising the transistors N1 and N2 for automatically connecting the gate of the transistor NO to either its drain or source depending on which has the lower potential. In the example of FIG. 11, a Zener diode Z10 clamps the gate voltage of the transistor NO.

Figure 12:
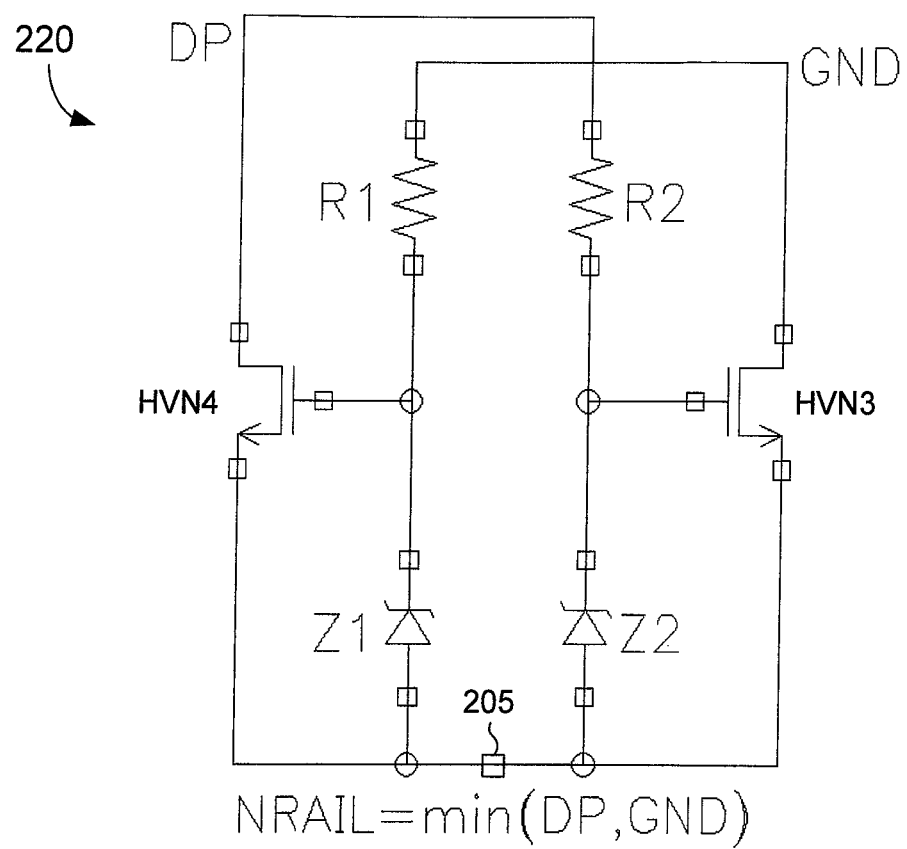
FIGS. 12 and 13 show schematic diagrams of supply voltage selection circuits in accordance with embodiments of the present invention.

FIG. 12 shows a schematic diagram of a supply voltage selection circuit 220 in accordance with an embodiment of the present invention. In the example of FIG. 12, the selection circuit 220 may be configured to provide a negative rail (NRAIL) from the most negative of the voltage on the common node DP and ground reference GND. For example, the node 205 of the selection circuit 220 may be connected to the node 205 of the gate control driver 202 of the switch circuit 101 (see FIG. 10) to provide a most negative NRAIL. As a particular example, if the voltage on the common node DP is 24V and GND is 0, then the Zener diode Z2 clamps the gate voltage of the transistor HVN3 to protect the gate-to-source voltage VGS of the transistor HVN3 and the resistor R2 limits the current through the Zener diode Z2. Because the transistor HVN3 is ON and transistor HVN3 is OFF, the NRAIL on the node 205 is 0V (i.e., from GND). In similar fashion, when the transistor HVN3 is ON and the transistor HVN2 is OFF, the NRAIL on the node 205 is connected to the common node DP.

Figure 13:
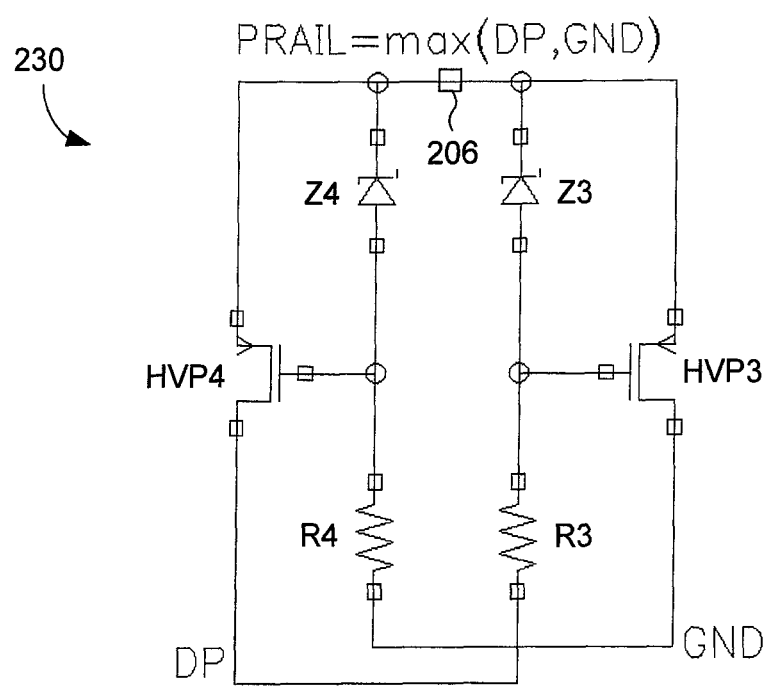

It is to be noted that the highest positive rail (PRAIL) and the lowest negative rail (NRAIL) can be implemented using the same method. For example, FIG. 13 shows a schematic diagram of a supply voltage selection circuit 230 in accordance with an embodiment of the present invention. In the example of FIG. 13, the selection circuit 230 may be configured to provide a positive rail (PRAIL) from the most positive of the voltage on the common node DP and ground reference GND. The node 206 of the selection circuit 230 may be connected to the node 206 of the gate control driver 202 of the switch circuit 101 (see FIG. 10) to provide a most positive PRAIL.

Figure 14:
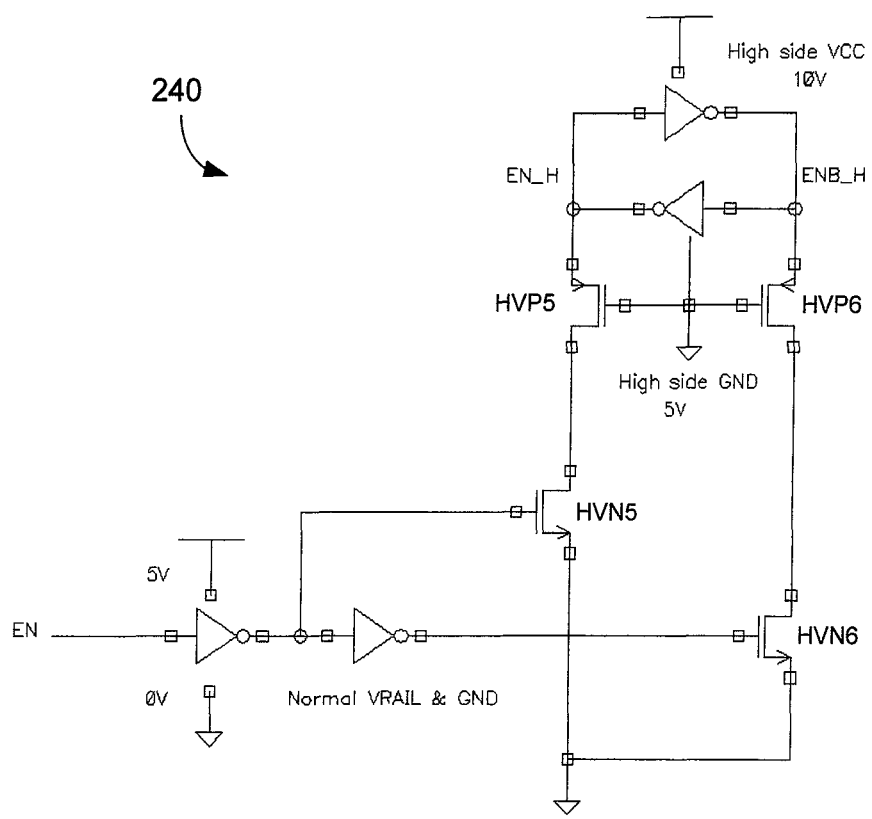
FIGS. 14 and 15 show schematic diagrams of voltage translators in accordance with embodiments of the present invention.
Figure 15:
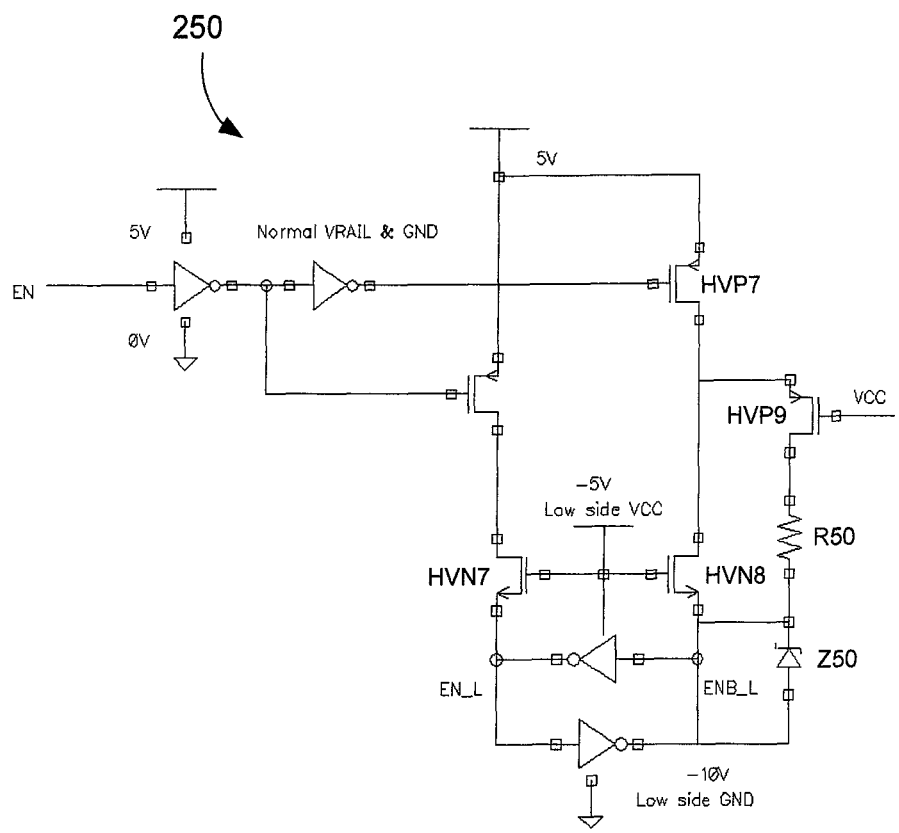

FIGS. 14 and 15 show schematic diagrams of voltage translators in accordance with embodiments of the present invention. Particular voltages, such as 5V, in FIGS. 14 and 15, are provided as examples, not limitations. Generally speaking, a switch circuit 101 may be turned ON or OFF by an enable signal. In the example of FIG. 14, a high voltage side translator 240 translates an enable signal EN to a most positive voltage PRAIL=max(DP,GND) to generate the EN_H and ENB_H signals, which are used to control the high side current source 208 ON or OFF in the gate control driver 202 (see FIG. 10).

In the example of FIG. 15, a low voltage side translator 250 translates the enable signal EN to a low voltage NRAIL=min(DP,GND) to generate the EN_L and ENB_L signals, which are used to turn ON or OFF the transistor HVN1 of the gate control driver 202 (see FIG. 10) to pull down or not the gate voltage of the transistor NO to the most negative voltage NRAIL. In the example of FIG. 15, the transistor HVP9 is part of a branch that enables pull down of the gate of the transistor NO when the supply voltage VCC is powered off to 0V. That is, when there is no power to a switch circuit 101, the gate of the transistor NO can be pulled down to the most negative voltage NRAIL by the transistor HVN1 of the gate control driver 202 to ensure the switch circuit 101 is OFF (i.e., open).

Figure 16:
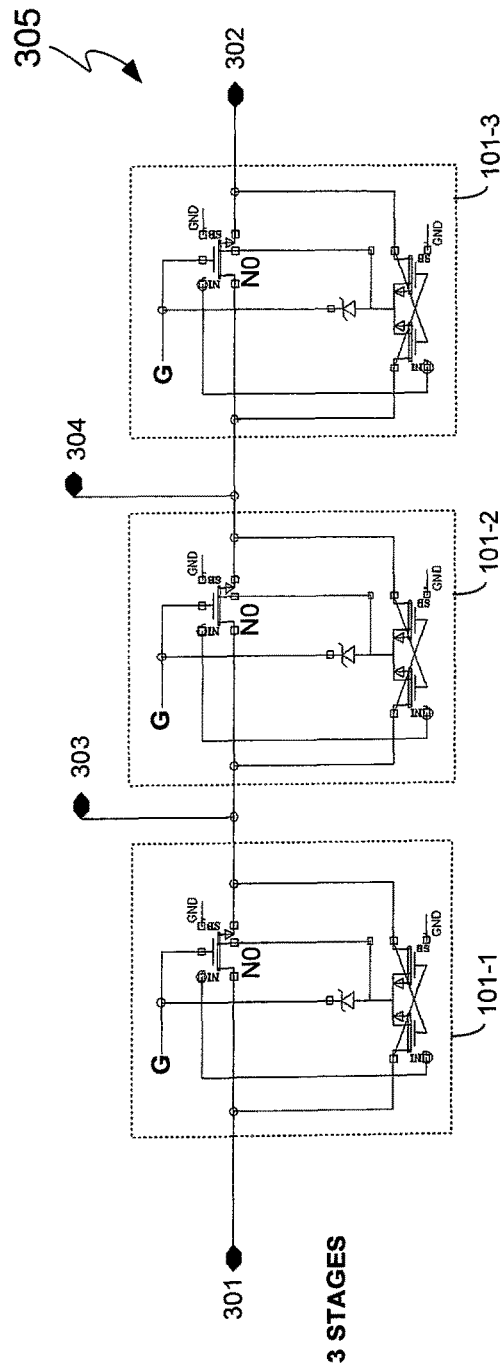
FIGS. 16 and 17 show schematic diagrams of switch paths in accordance with embodiments of the present invention.
Figure 17:
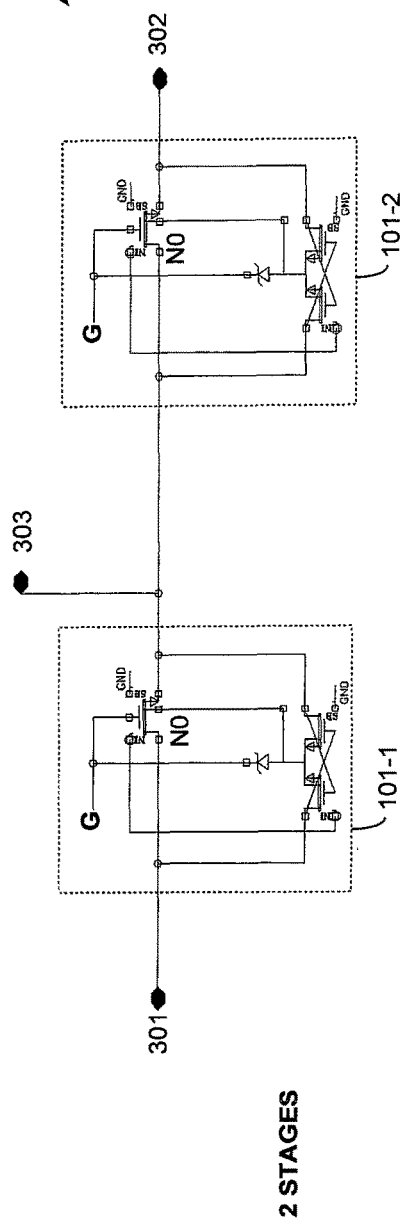

FIGS. 16 and 17 show schematic diagrams of switch paths in accordance with embodiments of the present invention. In the example of FIG. 16, a switch path 305 has three series-connected switch circuits 101 (101-1, 101-2, 101-3) that connect a common node 301 to an end node 302. In the example of FIG. 16, the drain of the transistor NO of the switch circuit 101-1 is connected to the common node 301, the source of the transistor NO of the switch circuit 101-1 is connected to the drain of the transistor NO of the switch circuit 101-2, the source of the transistor NO of the switch circuit 101-2 is connected to the drain of the transistor NO of the switch circuit 101-3, and the source of the transistor NO of the switch circuit 101-3 is connected to the end node 302. Additional switch paths may be connected to the nodes 303 and 304.

The switch path 305 is an example of a 3-stage switch path, i.e., a switch path with three switch circuits 101. FIG. 17 shows a switch path 306 that has 2-stages. The switch paths 305 and 306 are otherwise the same. In general, the number of stages can be, but not necessarily, based on the BVDSS requirement for the switch path. For example, assuming 3 threshold voltages VTH for a 3-stage switch path, there will be threshold voltages VT1, VT2, and VT3, one for each main switch. However, during a surge, the BVDSS break down voltage may be different. The drain-to-source voltage VDS of the main switch may be controlled so as not to exceed VT1 and get into the negative resistance region. Without having a BVDSS model, it is more robust to rely on active clamping with Zener diodes, as in the switch circuit 101 of FIG. 10, to limit the drain-to-source voltage VDS of the main switch.

Switch circuits with high voltage surge suppression have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A switch device comprising:
   a switch path that connects a first node to a second node, the switch path comprising a switch circuit, the switch circuit comprising:
   a first transistor disposed along the switch path,
   a voltage divider circuit configured to provide a voltage corresponding to an average of a drain voltage of the first transistor and a source voltage of the first transistor to the bulk of the first transistor when the first transistor is turned on, and
   a first Zener diode having a first end connected to a gate of the first transistor and a second end connected to the bulk of the first transistor,
   wherein the switch circuit is configured to automatically connect the bulk of the first transistor to either a drain of the first transistor or a source of the first transistor to turn OFF the first transistor and open the switch path in response to a surge voltage on the switch path.

2. The switch device of claim 1, wherein the switch circuit is configured to automatically connect the bulk of the first transistor to the drain of the first transistor to withstand a positive surge voltage on the switch path.

3. The switch device of claim 1, wherein the switch circuit is configured to automatically connect the bulk of the first transistor to the source of the first transistor to withstand a negative surge voltage on the switch path.

4. The switch device of claim 1, wherein the switch circuit further comprises:
   a cross-coupling circuit that is configured to automatically connect the bulk of the first transistor to either the source of the first transistor or the drain of the first transistor based on a polarity of the surge voltage.

5. The switch device of claim 1, wherein the switch circuit further comprises:
   a gate control driver that is connected to the gate of the first transistor and is configured to turn the transistor ON or OFF in response to an enable signal.

6. The switch device of claim 1, wherein the voltage divider circuit comprises:
   a second transistor having a drain coupled to a source of the first transistor, a source coupled to a bulk of the first transistor, and a gate connected to a gate of the first transistor; and
   a third transistor having a source coupled to a drain of the first transistor, a drain coupled to a bulk of the first transistor, and a gate connected to a gate of the first transistor.

7. The switch device of claim 1, wherein the first end of the first Zener diode is a cathode of the first Zener diode, and the second end of the first Zener diode is an anode of the first Zener diode.

8. A method of connecting nodes of a switch device, the method comprising:
   connecting a common node to a first end node through a switch path that comprises a first transistor;
   automatically connecting a bulk of the first transistor to either a source of the first transistor or a drain of the first transistor depending on a potential on the source of the first transistor relative to a potential on the drain of the first transistor;
   providing a voltage corresponding to an average of a drain voltage of the first transistor and a source voltage of the first transistor to the bulk of the first transistor when the first transistor is turned on; and
   clamping a voltage at the gate of the first transistor at a clamping level in response to a surge voltage through the switch path.

9. The method of claim 8, wherein the bulk of the first transistor is connected to the source of the first transistor to withstand a negative surge voltage on the switch path.

10. The method of claim 8, wherein the bulk of the first transistor is connected to the drain of the first transistor to withstand a positive surge voltage on the switch path.

11. A switch device comprising:
- a common node;
- a switch path that connects the common node to a first end node, the switch path comprising a first transistor that is connected in series to a second transistor, a source of the first transistor is connected to a drain of the second transistor, and a bulk of the first transistor is connected to either the source of the first transistor or a drain of the first transistor depending on a potential on the source of the first transistor relative to a potential on the drain of the first transistor, the switch path comprising a switch circuit,
- wherein the switch circuit comprises:
  - a first resistor;
  - a second resistor;
  - a first Zener diode having an anode connected to a bulk of the first transistor and a cathode connected to the drain of the first transistor through the first resistor;
  - a second Zener diode having an anode connected to the bulk of the first transistor and a cathode connected to the source of the first transistor through the second resistor;
  - a voltage divider comprising a first divider transistor coupled across the first Zener diode and a second divider transistor coupled across the second Zener diode,
  - wherein a drain of the first divider transistor is connected to a source of the first transistor, a source of the second divider transistor is connected to the drain of the first transistor, a source of the first divider transistor is connected to a drain of the second divider transistor, and a gate of the first divider transistor and a gate of the second divider transistor are both connected to the gate of the first transistor.

12. The switch device of claim 11, wherein the drain of the first transistor is connected to the common node.

13. The switch device of claim 12, wherein the drain of the third transistor is connected to the common node.

14. The switch device of claim 13, wherein the drain of the third transistor is connected to the common node through the first transistor.

15. The switch device of claim 11, wherein the source of the first transistor is connected to the bulk of the first transistor and the source of the second transistor is connected to the bulk of the second transistor to withstand a negative surge voltage on the switch path.

16. The switch device of claim 11, wherein the drain of the first transistor is connected to the bulk of the first transistor and the drain of the second transistor is connected to the bulk of the second transistor to withstand a positive surge voltage on the switch path.

17. The switch device of claim 11, wherein the first and second transistors comprise NMOS transistors.

18. The switch device of claim 11, wherein the switch circuit further comprises:
- a cross-coupling circuit that automatically connects the bulk of the first transistor to the source of the first transistor when the source of the first transistor has a lower potential compared to the drain of the first transistor and automatically connects the bulk of the first transistor to the drain of the first transistor when the drain of the first transistor has a lower potential compared to the source of the first transistor.

19. The switch device of claim 18, wherein the cross-coupling circuit comprises:
- a fifth transistor; and
- a sixth transistor,
- wherein a source of the fifth transistor is connected to a drain of the sixth transistor and to the bulk of the first transistor, a drain of the fifth transistor is connected to the source of the first transistor, a source of the sixth transistor is connected to the drain of the first transistor, a gate of the fifth transistor is connected to the drain of the first transistor, and a gate of the sixth transistor is connected to the source of the first transistor.

20. The switch device of claim 19, wherein the switch circuit further comprises:
- a gate control driver circuit that is connected to the gate of the first transistor and turns the first transistor ON or OFF in response to an enable signal.

* * * * *